United States Patent [19]

Potter et al.

[11] Patent Number: 4,899,342
[45] Date of Patent: Feb. 6, 1990

[54] METHOD AND APPARATUS FOR OPERATING MULTI-UNIT ARRAY OF MEMORIES

[75] Inventors: David Potter, Acton; Laurence N. Provost, Arlington; John M. Baron, Grafton; David Stefanovic, Allston; Eric D. Sharakan, Brighton; David A. Sheppard, Cambridge; Marshall A. Isman, Newton, all of Mass.

[73] Assignee: Thinking Machines Corporation, Cambridge, Mass.

[21] Appl. No.: 150,814

[22] Filed: Feb. 1, 1988

[51] Int. Cl.$^4$ ............................................. G06F 11/10
[52] U.S. Cl. .................................... 371/10.1; 371/40.1
[58] Field of Search ................. 371/10, 38, 10.1, 10.2, 371/10.3, 37.1, 40.1, 40.2, 40.3, 40.4; 365/200, 201; 364/200, 900

[56] References Cited

U.S. PATENT DOCUMENTS

| | | | |
|---|---|---|---|
| 4,646,304 | 2/1987 | Fossati | 371/38 |
| 4,654,847 | 3/1987 | Dutton | 371/10 |
| 4,703,453 | 10/1987 | Shinoda | 371/10 |
| 4,710,934 | 12/1983 | Traynor | 371/38 |

*Primary Examiner*—Michael R. Fleming

*Attorney, Agent, or Firm*—Pennie & Edmonds

[57] ABSTRACT

A method and apparatus are disclosed for operating a multi-unit memory system so that one of such units may readily be replaced in service. The system comprises an error correction code (ECC) generation circuit, a plurality of read/write memory units and at least one spare read/write memory unit. The ECC circuit generates an error correction code for each block of data to be stored in the system and supplies this code along with the block of data to the memory units for storage. The system further comprises means for generating from a sequence of blocks of data and associated error correction codes retrieved from these memory units a sequence of bits which correct an error in the information retrieved from one memory unit and means for writing this sequence of correction bits to the spare read/write memory unit. Advantageously, the system also comprises means for rewriting the sequence of correction bits to a memory unit after a faulty memory unit has been repaired or replaced. Preferably, the sequence of correction bits is generated by the same ECC circuit which generates the error correction codes; and the sequence of correction bits is connected to the spare memory unit, a repaired unit or a replacement unit through an array of multiplexers.

18 Claims, 2 Drawing Sheets

METHOD AND APPARATUS FOR OPERATING MULTI-UNIT ARRAY OF MEMORIES

CROSS REFERENCE TO RELATED APPLICATION

A related application is W. Daniel Hillis et al., "Storage System Using Multiple Mechanically-Driven Storage Units", Ser. No. 732,353, filed May 8, 1985 which is incorporated herein by reference.

BACKGROUND OF THE INVENTION

The above referenced application describes a memory system in which a word of data is stored across two or more asynchronous memory devices such as disk drives. For example, each of the bits in a thirty-two bit word of data and a seven bit error correction code is stored in a different one of thirty-nine disk drives.

The error correction code that is associated with each word stored in the memory system makes it possible to detect up to two bits of error in a word read from the memory system and to correct one bit of error. As a result, it is possible to operate the memory system even if one of the disk drives is inoperative. Thus, for each word, the bit that would otherwise have been read from the inoperative disk drive is calculated from the information in the other bits of the word and the error correction code that are read from the other disk drives.

This, however, only represents a temporary solution because in such circumstances the entire system is vulnerable to an error in any additional bit. Accordingly, it is desirable to replace the inoperative disk drive as expeditiously as possible. Replacement of a disk drive, however, and in particular replacement of the data stored in the disk drive, is a relatively time consuming task with even the most sophisticated disk drives because of their large capacity.

SUMMARY OF THE INVENTION

The present invention is directed to a method and apparatus for operating a multi-unit memory system so that one of such units may readily be replaced in service.

In a preferred embodiment of the invention, the system comprises an error correction code (ECC) generation circuit, a plurality of read/write memory units and at least one spare read/write memory unit. The ECC circuit generates an error correction code for each block of data to be stored in the system and supplies this code along with the block of data to the memory units for storage. The system further comprises means for generating from a sequence of blocks of data and associated error correction codes retrieved from these memory units a sequence of bits which correct an error in the information retrieved from one memory unit and means for writing this sequence of correction bits to the spare read/write memory unit.

Advantageously, the invention also comprises means for rewriting the sequence of correction bits to a memory unit after a faulty memory unit has been repaired or replaced In the preferred embodiment of the invention, the sequence of correction bits is generated by the same ECC circuit which generates the error correction codes; and the sequence of correction bits is connected to the spare memory unit, a repaired unit or a replacement unit through an array of multiplexers.

BRIEF DESCRIPTION OF THE DRAWINGS

These and other objects, features and advantages of the invention will become more readily apparent from the following detailed description of the invention in which.

DETAILED DESCRIPTION OF THE PREFERRED EMBODIMENT

Figure 1:
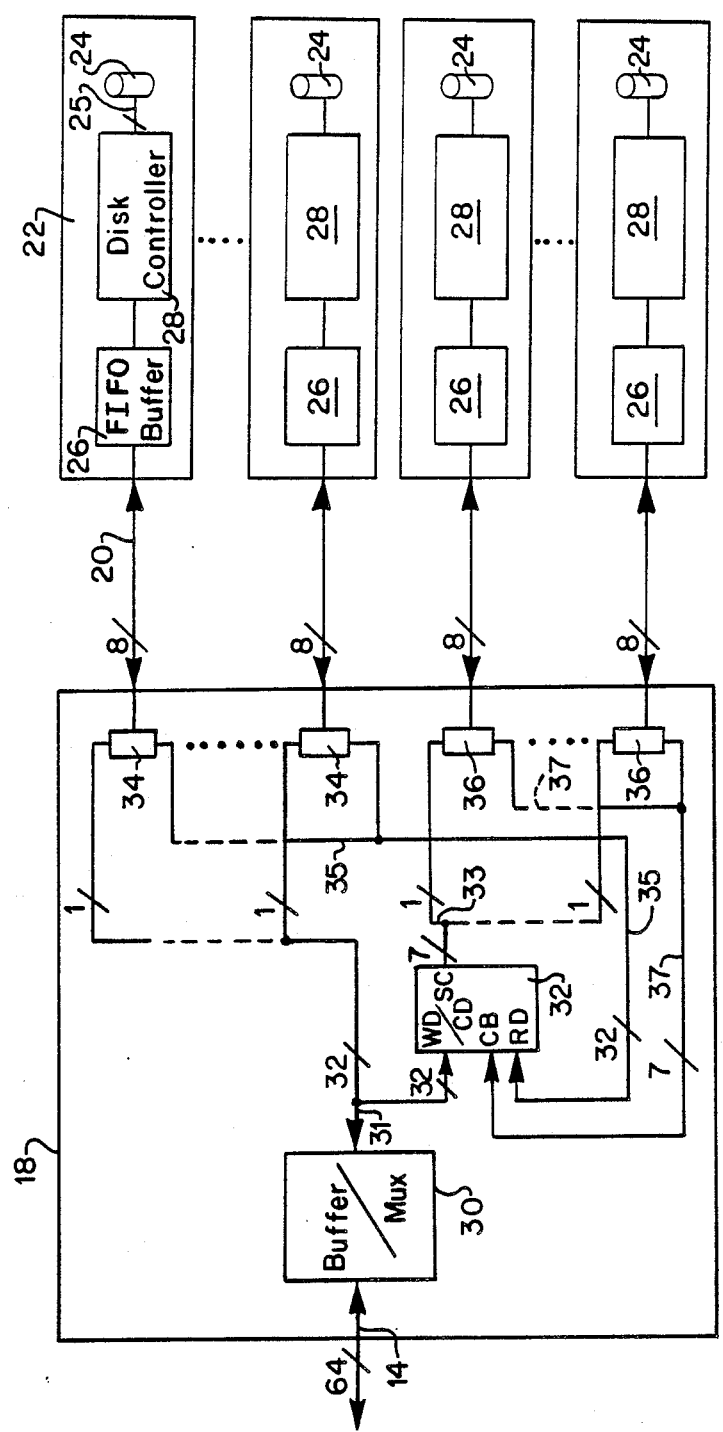
FIG. 1 is a schematic drawing of a multi-unit memory system such as that disclosed in the '353 application.

As shown in FIG. 1 which is adapted from the above-referenced patent application, a multi-unit memory system 10 illustratively comprises a bus adaptor 18 and a plurality of disk drive units 22. Each bus adaptor comprises a buffer/multiplexer 30, an error correction code (ECC) generation circuit 32, and first and second arrays of shift registers 34, 36. Each disk drive unit comprises a first-in, first-out (FIFO) buffer 26, a disk controller 28 and a disk drive 24. In the embodiment disclosed in the aforementioned application, there are thirty-two shift registers 34, seven shift registers 36 and thirty-nine disk drive units. All thirty-nine shift registers 34, 36 are identical and all disk drive units 22 are identical.

Data flows between a computer (not shown) and the bus adaptor via a bus 14 which illustratively includes sixty-four bidirectional data paths. These data paths are divided into two groups of thirty-two paths each. Data flows from the buffer/multiplexer to shift registers 34 and ECC circuit 32 via data bus 31 which has thirty-two data paths. Data also flows from the ECC circuit to the buffer/multiplexer over the same bus. Data flows between the bus adaptor and each disk drive unit 22 via a bidirectional bus 20 which illustratively includes eight parallel data paths. Within each disk drive unit, data flows between the controller and the drive on a bidirectional serial bus 25. Advantageously, each parallel bus 20 transmits data and commands in accordance with the Small Computer System Interface defined in U.S. Dept. of Commerce, National Bureau of Standards Publication X3T9 2/82-2, Revision 14B, Nov. 6, 1984; and each serial bus 25 carries data and commands serially in accordance with the Enhanced Small Device Interface defined for example in Magnetic Peripherals, Inc. publication 77738076-D, 1984, both of which are incorporated herein by reference.

To write data to the disk drive units, the computer sends a seek command to the disk drive units instructing each unit to move the write head of its disk drive to a specified track (or cylinder). The computer then transmits to each disk drive unit a write command specifying a disk address and word count. During the write operation, buffer/multiplexer 30 alternately provides a bit of data from each data path in one group of thirty-two data paths or the other group of thirty-two data paths to a WD/CD (write data or corrected data) port of the ECC circuit via bus 31 while storing data from the nonselected group of thirty-two data paths. At the same time, each of the thirty-two bits provided to the ECC circuit is also shifted into one of the thirty-two shift registers 34. The ECC circuit generates for each block of thirty-two bits that is presented to it seven bits of error correction code and provides these seven bits to the seven shift registers 36 via the SC port and bus 33.

After eight bits of data are shifted into each shift register, the eight bits are read out in parallel from each of the thirty-nine shift registers 34, 36 and are provided via the thirty-nine data buses 20 to the thirty-nine disk drive units 22. The data is then stored in a large (e.g. 14 kilobyte) FIFO buffer 26 in each disk drive unit and is supplied by the buffer to the controller and then to its associated disk drive. As a result, each block of thirty-two bits of data and associated seven bits of error correction code is stored on the disks of thirty-nine disk drives 24, each bit of the block illustratively being stored at the same address on a different disk drive.

When a read is to be performed from the disk drives, the computer broadcasts a seek command and a read command to the disk drive controllers. In response, each disk drive reads data from the disk and provides it serially to the FIFO buffer in its associated controller. When each FIFO buffer has sufficient data, eight bits of data are read from each FIFO buffer and provided in parallel on each of the thirty-nine data busses 20 to each of shift registers 34, 36. As a result, the thirty-two shift registers 34 are loaded with eight blocks of data of thirty-two bits each and the seven shift registers 36 are loaded with eight sets of error correction codes of seven bits each.

A bit of data from each shift register 34 is then read by the ECC circuit in parallel via bus 35 and the RD (read data) port. The ECC circuit then generates the error correction code anew from the thirty-two bits that are read out of these thirty-two shift registers and compares this code with seven bits of error correction code which are read in parallel from the seven shift registers 36 via bus 37 and the CB (check bit) port. If the two error correction codes are the same, the thirty-two bits of data are provided to buffer/multiplexer 30 which provides these bits in parallel to one group of thirty-two lines of data bus 14. If the two error correction codes are different, the ECC generation circuit can correct the data in the case of a one bit error and identify the errors in the case of a two bit error.

Further details of the operation of the circuitry of FIG. 1 are set forth in the aforementioned '353 application.

In a preferred embodiment of the present invention, three additional disk drive units are provided as service spares. If a disk drive should become inoperative, the data stored in the disk drive can be reconstructed by the ECC circuit and this data can be stored in a spare disk drive. Upon repair or replacement of the inoperative disk drive unit, the data stored in the spare disk drive unit can then be restored to the repaired or replaced drive.

Figure 2:
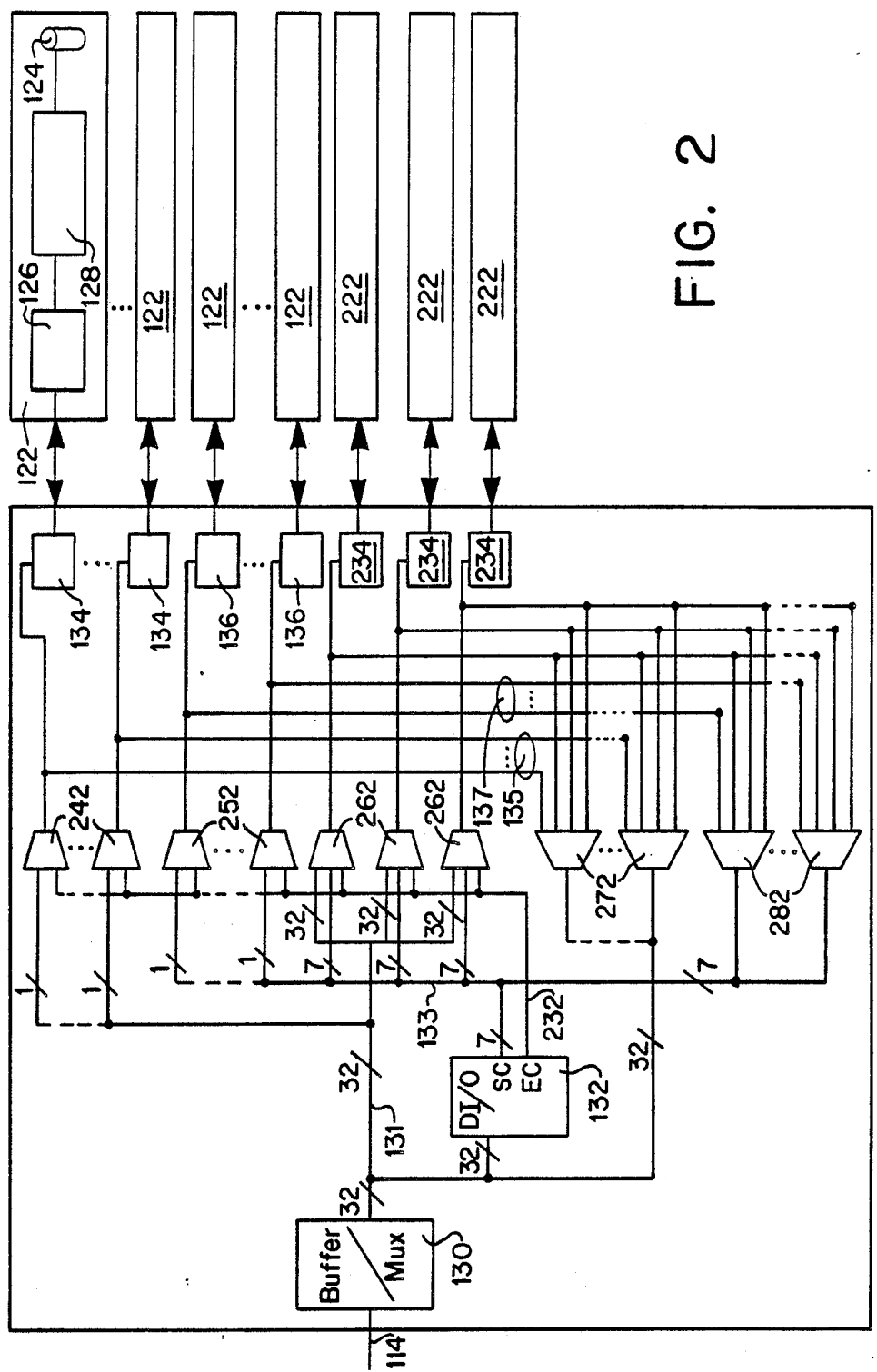
FIG. 2 is a schematic drawing of the preferred embodiment of the invention.

A preferred embodiment of apparatus for practicing the invention is depicted in FIG. 2. As shown therein, the apparatus comprises a bus adaptor 118 and a plurality of disk drive units 122. The bus adaptor comprises a buffer/multiplexer 130, an ECC generation circuit 132, thirty-two shift registers 134 and seven shift registers 136. Each disk drive unit comprises a FIFO buffer 126, a disk controller 128 and a disk drive 124. The foregoing elements are functionally the same as the corresponding elements depicted in FIG. 1 and bear the same identification numerals incremented by 100. ECC circuit 132 differs from EC circuit 32 of FIG. 1 in that it uses bidirectional ports DI/O (data input/output) and SC for data and error correction codes and that an error corrected signal is made available from an EC (error corrected) port of the circuit to serial bus 232. Disk drive units 122 differ from units 22 in that bus 125 is a parallel bus. Illustratively, the ECC generation circuit is a Texas Instruments 74AS632 and the disk drives are Model 1375,170 megabyte drives manufactured by Micropolis, Inc. Other disk drives can be used, such as the Control Data Model 9415 as well as other ECC circuits. Shift registers 134 and 136 are identical, each having a bidirectional serial port and a bidirectional parallel port. Advantageously, the FIFO buffers that are used to buffer data being written to or read from the disk drives are 64 kilobyte buffers.

In addition to the foregoing equipment, the apparatus of FIG. 2 also comprises three spare disk drive units 222 and circuitry for interfacing with these disk drive units. The interfacing circuitry comprises three shift registers 234 and five sets of multiplexers 242, 252, 262, 72, 282.

The first set of multiplexers comprises thirty-two two-to-one multiplexers which connect one of two input data streams to the inputs to shift registers 134. For each multiplexer in this set, one input is one of the thirty-two data paths from buffer/multiplexer 130 and the other input is the error corrected signal from the ECC generation circuit 132.

The second set of multiplexers comprises seven two-to-one multiplexers which connect one of two input data streams to the inputs to shift registers 136. For each multiplexer in this set, one input is one of the seven signal paths bearing error correction codes generated by the ECC circuit 132 and the other input is the error corrected signal from the ECC generation circuit 132.

The third set of multiplexers comprises three forty-to-one multiplexers which connect one of forty input data streams to the inputs to shift registers 234. Each multiplexer in this set has the same forty inputs: each of the thirty-two data paths from buffer/multiplexer 130, each of the seven signal paths which bear error correction codes from ECC circuit 132 and the path 232 which bears the error corrected signal from the ECC generation circuit.

The fourth set of multiplexers comprises thirty-two four-to-one multiplexers which connect one of four input data streams from shift registers 134 234 to the data input/output port of error correction circuit 132 via bus 131. For each multiplexer in this set, one input is one of the thirty-two data paths 135 from the thirty-two shift registers 134. The other three inputs to each multiplexer are the same and constitute the outputs of the three shift registers 234.

The fifth set of multiplexers comprises seven four-to-one multiplexers which connect one of four input data streams from shift registers 136, 234 to the SC port of error correction circuit 132 via bus 133. For each multiplexer in this set, one input is one of seven data paths 137 from the seven shift registers 136. The other three inputs to each multiplexer are the outputs of the three shift registers 234.

In normal operation, control signals (not shown) are set so that multiplexers 242 direct the signals from data paths 131 to the inputs to shift registers 134 and multiplexers 252 direct the signals from data paths 133 to the inputs to shift registers 136. In such circumstance, the circuitry of FIG. 2 operates the same as that of FIG. 1 to write data onto the disk drives of disk drive units 122.

To read data, each of the thirty-nine multiplexers 272, 282 are set by appropriate control signals (not shown) to select the data on each of thirty-two data paths 135 and seven data paths 137 and provide such data via buses 131, 133 to the DI/O and SC ports, respectively, of ECC circuit 132. In other respects, a read operation proceeds in the same fashion as that of the apparatus of FIG. 1.

If, however, one of disk drive units 122 becomes inoperative for any reason, the present invention may be practiced so as to recreate a record of the data in that disk drive unit. In accordance with the invention, data from the thirty-nine disk drive units 122 is read out but any data from the faulty disk drive is ignored. From the sequence of blocks of data and error correction codes from the other thirty-eight disk drives, the ECC circuit generates a sequence of error corrected signals which reproduces the data stored in the faulty disk drive. If the faulty disk drive is one of those thirty-two drives that stored data supplied by the computer, the error corrected signal can then be supplied to the computer in place of the data from the faulty disk drive.

The error corrected signal is also used in connection with the invention to recreate the record of the data stored in the faulty disk drive. In particular, as the data is being read from disk drives 122, the error corrected signal is applied via signal path 232 to each of multiplexers 262. Control signals (not shown) at one of these multiplexers select the error corrected signal and apply it via a shift register 234 to one of the spare disk drive units 232 where the recreated data is stored.

Subsequently, the recreated data stored on the spare disk drive can be read out in place of the faulty disk drive via its associated shift register 234 and one of thirty-nine multiplexers 272, 282. In particular, the multiplexer 272, 282 which is associated with the faulty disk drive is set by a control signal (not shown) to select data from the shift register connected to the spare disk drive instead of that connected to the faulty disk drive and to its output.

In addition, the spare drive can also be accessed by signals from data bus 131 or signal paths 133 via multiplexers 262. In such case, control signals (not shown) cause the multiplexer 262 that is connected to the spare disk drive to select the path associated with the faulty disk drive. As a result, data or error correction codes intended for the faulty disk drive are written to the spare disk drive.

For operating reasons, it is advantageous to replace or repair the faulty disk drive as expeditiously as possible and to restore the information in the spare disk drive to the disk drive that has been replaced or repaired. This requires that the data be read from the disk drive units and written to the replacement disk drive. Because the capacity of the disk drives tends to be relatively large, this operation can take an appreciable amount of time. In accordance with the invention, however, this operation can be performed approximately within the time it takes just to read the disk drive units.

In particular, all the disk drive units 122 except for the replacement drive are read just as in the case of a faulty disk drive. As the drives are being read, the ECC circuit generates from the contents of these drives an error corrected signal. This error corrected signal is applied via bus 232 to each of multiplexers 242, 252. Control signals (not shown) select the multiplexer which is connected via a shift register 134, 136 to the replacement disk drive to apply to that disk drive the error corrected signal from ECC circuit 132. As a result, as disk drives 122 are read, the stored data in the replacement disk drive can be data to be regenerated and written into the drive.

Numerous variations may be made in the above described method and apparatus that are within the scope of the present invention. Different drives may be used in place of buffer/multiplexer 130 and ECC circuit 132 such as those described in the aforementioned '353 patent application. While the invention has been described in terms of a memory comprising an array of disk drive units, the invention may also be practiced with other types of data storage devices. In addition, while the invention has been described in terms of a system that provides for considerable flexibility of operation, portions of the invention may also be practiced in systems that do not have quite the same switching capability.

What is claimed is:

1. A multi-unit memory system comprising:
    an error correction code generation circuit which generates for each block of data to be stored in said memory system an error correction code, each block of data comprising a first plurality of digits and each error correcting code comprising a second plurality of digits from which at least one digit of error may be detected and corrected in the block of data,
    a plurality of read/write memory units, which store the digits of said blocks of data and associated error correction codes generated by said error correction code generation circuit and read said digits, at least some of the different digits of each code and its associated data block being stored in different memory units,
    at least one spare read/write memory unit that is similar in operation to an individual read/write memory unit of said plurality of read/write memory units,
    means for generating from the digits of a block of data and associated error correction code read from said memory units a digit which corrects an error in a digit read from one of said memory units, said generating means operating on a sequence of said blocks of data and associated error correction codes to generate a sequence of correct digits, and
    means for accessing the spare read/write memory unit to store therein said sequence of correct digits as the sequence of blocks of data and associated error correction codes are read from the plurality of read/write memory units.

2. The system of claim 1 further comprising first and second multiplexers, said first multiplexers selectively supplying to said plurality of read/write memory units either blocks of data and error correction codes or said sequence of correct digits of data and said second multiplexers supplying output signals from either said plurality of memory units or said spare memory unit.

3. The system of claim 2 wherein there are as many first multiplexers and as many second multiplexers as there are memory units in said plurality of read/write memory units, each said first multiplexer supplying one of said plurality of read/write memory units and each of said second multiplexers multiplexing signals from all of said spare memory units and a different one of each of said plurality of memory units.

4. The system of claim 3 wherein there are thirty-nine read/write memory units in said plurality of memory units and three spares.

5. The system of claim 1 wherein each digit in a block of data and its associated error correction codes is stored in a different read/write memory unit.

6. The apparatus of claim 1 wherein each read/write memory unit and each spare read/write memory unit is an identical disk drive.

7. The method of operating a multi-unit memory system comprising the steps of:

generating for each block of data to be stored in said memory system an error correction code from which at least one bit of error may be detected and corrected in the block data, each block of data comprising a first plurality of digits and each error correcting code comprising a second plurality of digits, storing in a plurality of read/write memory units the digits of said blocks of data and associated error correction codes, at least some of the different digits of each code and its associated data block being stored in different memory units, generating from the digits of a block of data and associated error correction code read from said memory units a digit which corrects an error in a digit read from one of said memory units, said generating step operating on a sequence of said block of data and associated error correction codes to generate a sequence of correct digits, and storing in a spare read/write memory unit that is similar in operation to one of the read/write memory units of said plurality of read/write memory units said sequence of corrects digits as the sequence of blocks of data and associated error correction codes are read from the plurality of read/write memory units.

8. The method of claim 7 further comprising the steps of:

repairing or replacing the memory unit from which said error was read, generating from a sequence of blocks of data and associated error correction codes read from said plurality of memory units except for the unit that was repaired or replaced a sequence of digits which recreate information previously stored in the memory unit which was repaired or replaced, and writing on the memory unit that was repaired or replaced said sequence of digits.

9. The system of claim 7 wherein each digit in a block of data and its associated error correction codes is stored in a different read/write memory unit.

10. The method of claim 7 wherein each write/read memory unit and each spare read/write memory unit is an identical disk drive.

11. A multi-unit memory system comprising:

an error correction code generation circuit which generates for each block of data to be stored in said memory system an error correction code, each block of data comprising a first plurality of digits and each error correcting code comprising a second plurality of digits from which at least one digit of error may be detected and corrected in the block of data, a plurality of read/write memory units, which store the digits of said blocks of data and associated error correction codes generated by said error correction code generation circuit and read said digits, data being written to said read/write memory units in parallel and being read from said read/write memory units in parallel, each of the different digits of each code and its associated data block being stored at the same address in different memory units, at least one spare read/write memory unit similar in operation to one of the read/write memory units of said plurality of read/write memory units and operating in parallel therewith, means for generating from the digits of a block of data and associated error correction code read from said memory units a digit which corrects a error in a digit read from one of said memory units, said generating means operating on a sequence of said blocks of data and associated error correction codes to generate a sequence of correct digits in place of a sequence of digits read from one of said memory units, and means for accessing the spare read/write memory unit to store therein said sequence of correct digits as the sequence of blocks of data and associated error correction codes are read from the plurality of read/write memory units.

12. The system of claim 11 further comprising first and second multiplexers, said first multiplexers selectively supplying to said plurality of read/write memory units either blocks of data and error correction codes or said sequence of correct digits of data and said second multiplexers supplying output signals from either said plurality of memory units or said spare memory unit.

13. The system of claim 12 wherein there are as many first multiplexers and as many second multiplexers as there are memory units in said plurality of read/write memory units, each said first multiplexer supplying one of said plurality of read/write memory units and each of said second multiplexers multiplexing signals from all of said spare memory units and a different one of each of said plurality of memory units.

14. The system of claim 11 wherein there are thirty-nine read/write memory units in said plurality of memory units and three spares.

15. The apparatus of claim 11 wherein each read/write memory unit and each spare read/write memory unit is an identical disk drive.

16. The method of operating a multi-unit memory system comprising the steps of:

generating for each block of data to be stored in said memory system an error correction code from which at least one bit of error may be detected and corrected in the block of data, each block of data comprising a first plurality of digits and each error correcting code comprising a second plurality of digits, storing in a plurality of read/write memory units blocks of data and associated error correction codes, data being written to said read/write memory units in parallel and data being read from said read/write memory units in parallel, each of the different digits of each code and its associated data block being stored at the same address in different memory units, generating from the digits of a block of data and associated error correction code read from said memory units a digit which corrects an error in a digit read from one of said memory units, said generating step operating on a sequence of said blocks of data and associated error correction codes to generate a sequence of correct digits in place of a sequence of digits read from one of said memory units, and storing in a spare read/write memory unit that operates in parallel to the read/write memory units of said plurality of read/write memory units said sequence of correct digits as the sequence of blocks of data and associated error correction codes are read from the plurality of read/write memory units.

17. The method of claim 16 further comprising the steps of:

repairing or replacing the memory unit from which said error was read, generating from a sequence of blocks of data and associated error correction codes read from said plurality of memory units except for the unit that was repaired or replaced a sequence of digits which recreate information previously stored in the memory unit which was repaired or replaced, and writing on the memory unit that was repaired or replaced said sequence of digits.

18. The method of claim 16 wherein each read/write memory unit and each spare read/write memory unit is an identical disk drive.

* * * * *